Jan. 19, 1954 R. J. AUST 2,666,906

SPIRAL TUNER

Filed April 18, 1950 2 Sheets-Sheet 1

INVENTOR.

Robert J. Aust

BY Nicholas Lange Jr.

ATTORNEY

Jan. 19, 1954 R. J. AUST 2,666,906

SPIRAL TUNER

Filed April 18, 1950 2 Sheets-Sheet 2

INVENTOR.
Robert J. Aust
BY
Nicholas Lange
ATTORNEY

Patented Jan. 19, 1954 2,666,906

UNITED STATES PATENT OFFICE 2,666,906

SPIRAL TUNER

Robert J. Aust, Indianapolis, Ind., assignor to P. R. Mallory & Co., Inc., Indianapolis, Ind., a corporation of Delaware Application April 18, 1950, Serial No. 156,595

7 Claims. (Cl. 336—139)

This invention relates generally to electromagnetic wave tuning devices operative over a wide band of high frequency ranges and has specific application to such devices including means and methods for inductively tuning high frequency apparatus, and the like.

Heretofore, inductance tuning devices have ordinarily comprised a helical coil or bare wire wound on a rotatable coil form. This coil was engaged by a conductive nib on a contactor assembly which was slideable longitudinally in response to rotation of the coil. In this manner, the contact nib moved along the coil thereby changing the inductance thereof to vary the resonant frequency with which the tuning device was associated.

The present invention has as its object the provision of inductive tuning devices having a new and improved coil form assembly to which an improved contact member and associated control elements are connected so as to particularly adapt the use of the tuning device for compact arrangement.

Another object of the present invention is to provide a contactor assembly in a new spiral tuner which will provide an improved and efficient means for receiving electromagnetic signals.

Still another object of the present invention is to provide an improved spiral wound tuning device adapted for inductive tuning a resonant circuit in the reception of ultra high frequency electromagnetic signals.

Still a further object of the present invention is to provide a new and novel tuning device wherein the inductive coil arrangement utilized thereon comprises a spiral ribbon wound conductor maintained upright on an insulative base.

Yet another object of the invention is to provide, in a spiral wound inductive tuning device, a contactor element slideably rotated on said spiral wound inductive tuner and making contact therewith by means of a link joint assembly.

Still another object of the present invention is a spiral wound inductive tuning device having closely spaced terminal strips so as to reduce inductive effects therein.

Yet another object of the present invention provides, in a tuner of the inductive type, a spiral wound conductor firmly molded in an insulative base so as to provide a unique inductor assembly adapted to be positioned in relatively compact and close quarters.

Although the novel features which are characteristic of the invention are set forth more in detail in the claims appended hereto, the nature and scope of the invention may be better understood by reference to the following description taken in connection with the accompanying drawing forming a part thereof, in which a specific embodiment has been set forth for purposes of illustration.

In the following description certain specific terms are used for convenience in referring to the various details of the invention. These terms are to be interpreted, however, in accordance with the state of the art.

Generally speaking, the present invention relates to continuously variable tuning devices of the inductance type. In accordance with the invention a spiral wound conductor having a ribbon configuration has one of its edges vertically embedded in an insulative base, such as a plastic, and held in an upright manner therein. The multiple turns of the conductor are closely spirally wound within each other and fixedly retained in the insulator base. A novel hinged contact arm having a wiper is then allowed to ride on the outer edge of the conductor in an essentially expanding manner dependent upon the angular relationship formed between the movable hinged separate portions thereof. Moreover, these portions act so that in closely moving toward each other the inductive effects of each arm operates so as to substantially cancel each other. This novel construction provides a tuner which simplifies dial or channel indicator arrangements and reduces the usual number of turns required for a tuning knob to obtain the same frequency vs. tuning characteristics. Thus, an essentially compact, simple and efficient tuner has been provided.

Figure 1:
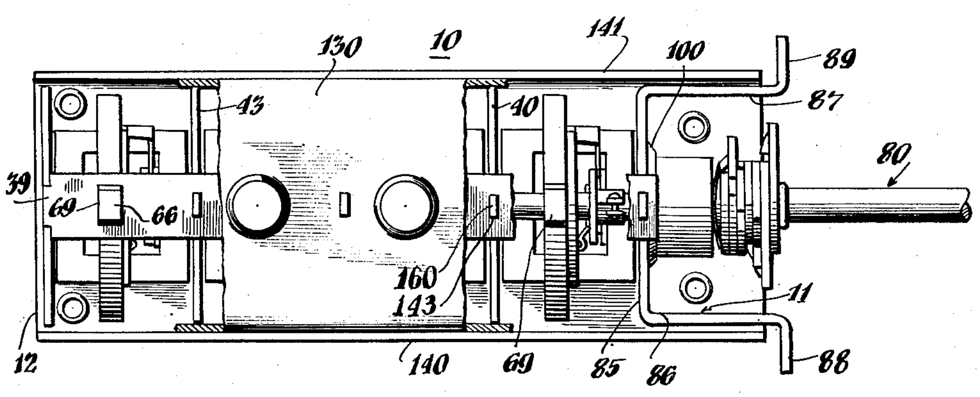
Figure 1 is a top plan view of an embodiment of the invention of a new spiral wound ribbon conductor tuning device.
Figures 2, 3:
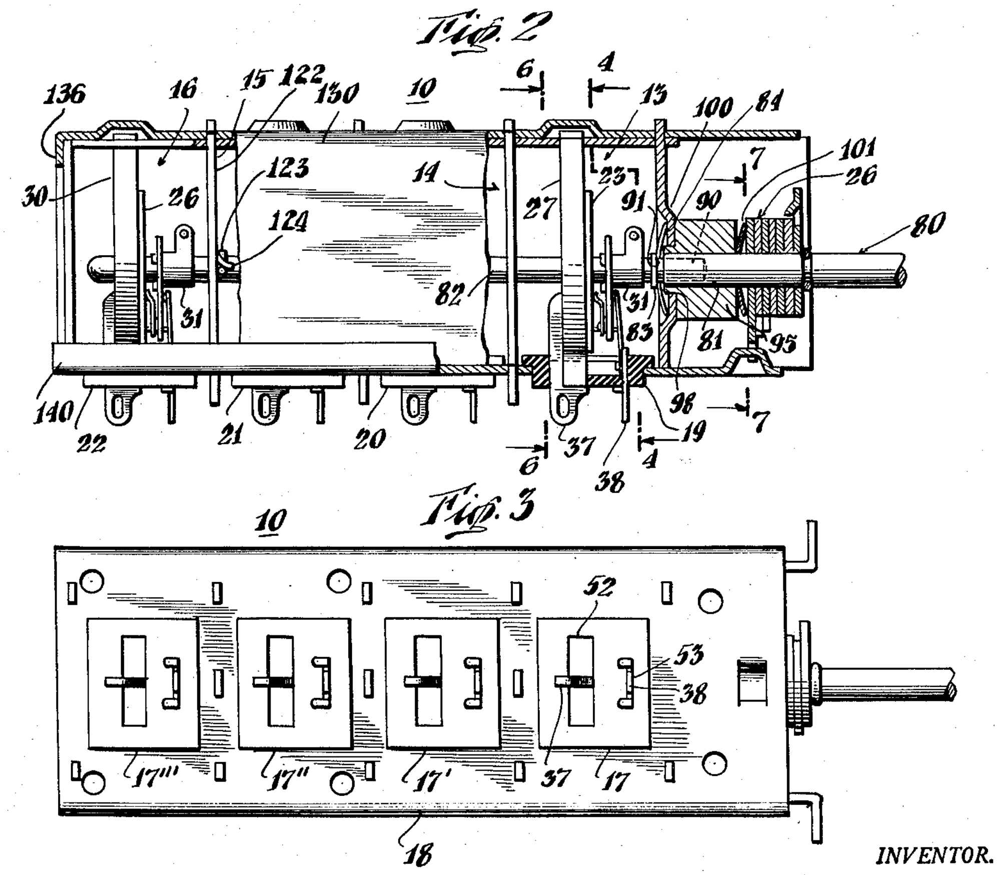
Figure 2 is a side view of the present invention, with portions thereof shown in elevation, adapted for use in illustrating the novel feature of the contactor and terminal assembly of the spiral wound tuner of the present invention.
Figure 3 is a bottom view of the embodiment of the invention as shown in Figures 1 and 2 and as adapted to illustrate the terminal construction thereof.

The variable inductance tuning device 10, as shown in the drawings, Figures 1–3, comprises a front support bracket or end plate 11, a back end plate or support 12, and a plurality of tuner sections 13—16 which are retained in cut-outs 17—17′—17″—17‴ of base plate 18. Each of these tuner sections individually includes one of the terminal bases 19—22 adapted to seat individual spiral wound coils 23, 26 as imbedded in coil forms 27, 30. Individual contactor means 31 are electrically connected to the coils so as to rotate with a shaft assembly 80 extending through each of the coils and coil forms. The amount or extent of angular displacement of the shaft within predetermined limits is controlled by means of a plurality of stop members 26 centrally mounted on the shaft. Each of the terminal plates, as above. includes a pair of terminals such as 37, 38, adapted to be connected to the coils, as will hereinafter appear. A clamp strap 39 and a plurality of metal partitions 40, 43 are provided to aid in the fixed support of the coil forms on the terminal bases to aid in the electrical shielding of each of the spiral wound coils.

Figures 4, 5:
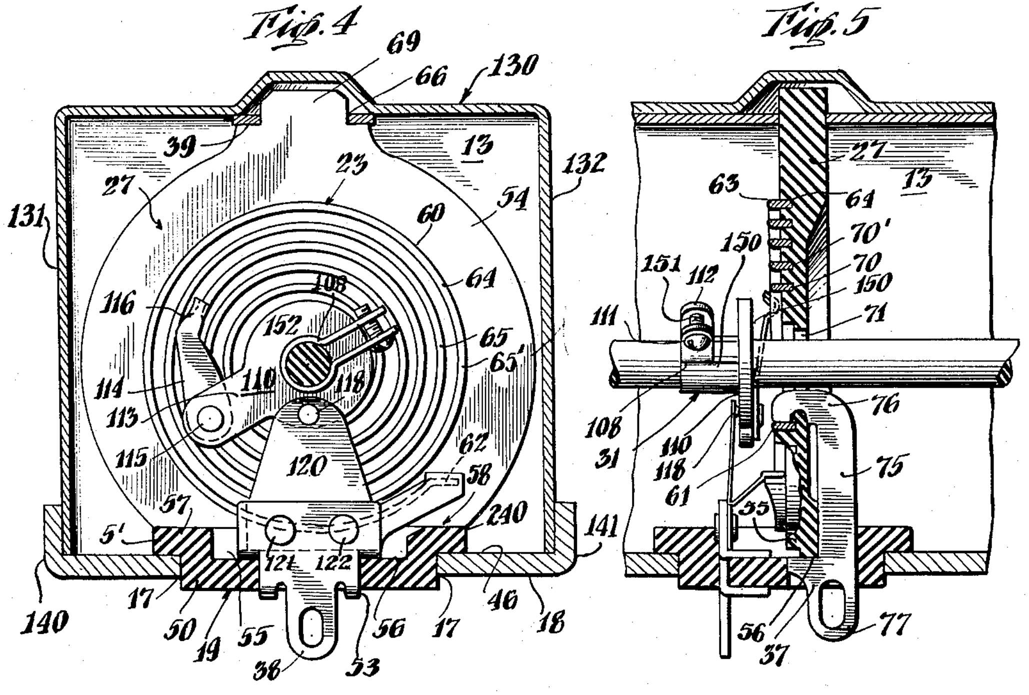
Figure 4 is a sectionalized view of the invention as take along line 4—4 of Figure 2 especially adapted to illustrate, along with Figure 5 below, the novel spiral wound construction of the tuner assembly.
Figure 5 is an enlarged cross-sectional view of the one of the spiral wound sections of the above tuner invention adapted to illustrate the mounting of the spiral ribbon conductors embedded in an insulative base.
Figure 6:
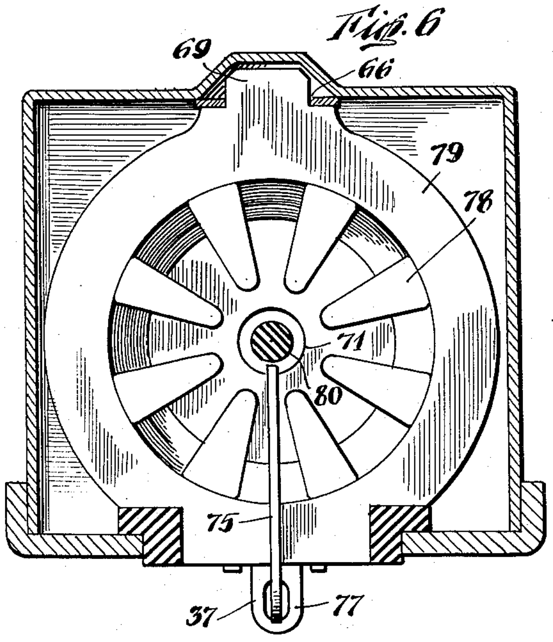
Figure 6 is a view of the base section maintaining the spiral conductor of the tuner as taken along line 6—6 of Figure 2.
Figure 7:
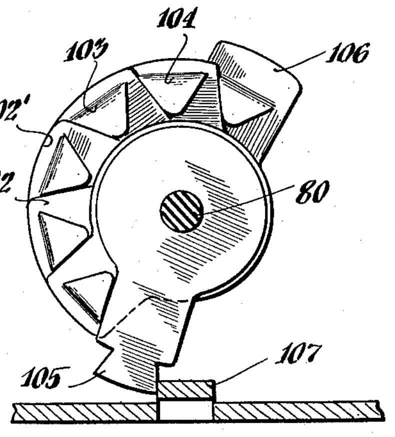
Figure 7 is a cross-sectional view of the stop mechanism utilized in the present invention for limiting the excursion of the contactor element along the spiral wound conductors embedded in the base elements of the timer.

Since the tuner sections are substantially alike and are constructed in a similar manner. a description of one of said sections will be deemed to apply as well to the other of said sections. For example, tuner section 13 comprises a portion of the tuner between partition or shield 40 and bracket 11. A cut-cut 17 (Figures 4–6), substantially of rectangular configuration is formed in base plate 18 of said tuner 10. Base plate 18 has small portions bent up to form side flaps 140 and 141.

Terminal base 19, which may be fabricated of an electrically insulative material such as plastic, has a configuration such that a portion of its thickness forms an upper level 51 having a diameter larger than the diameter of the cut-out formed in base plate 18, while its remaining thickness forms a lower level 50 for the terminal base 19 and has a smaller diameter which is adapted to fit into the said cut-out formed in plate 18. In this manner, a shoulder 240 is formed for terminal base 19 and is adapted to sit on the inside surface 46 of plate 18 in a substantially tight fashion.

Terminal base 19, as stated, has a portion thereof carved out to form a lower inside level 50 and an upper level 51. A plurality of slots 52, 53 are formed and cut through the said inside level, one of which slots. for example, has a T-shaped configuration. Both of the slots are adapted to retain and allow terminals 37 and 38 to penetrate therethrough.

Coil form 27 (Figures 4–6) has a circular central section 54, and extension 55 depending therefrom. Extension 55 has a surface 56 and is connected to central section 54 in such wise that a pair of shoulders 57 and 58 are formed in the coil form. The said extension 55 fits into slot 52 with shoulders 57 and 58 resting on the upper level 56 of terminal base 19. Oppositely disposed therefrom, and integrally formed with the central portion of the coil form is a projection 69 which is adapted to snugly fit into a slot 66 cut through clamp strap 39. Each coil form is thus mounted in a substantially upright manner with reference to base plate 18. Further, each of the said coil forms has a central aperture 71 cut therethrough, the utility of which will be hereinafter seen.

Each coil or inductance, for example, coil 23, comprises a predetermined length or strip conductor 60 contained between its ends 61, 62. Conductor 60 has edges 63, 64 of extremely narrow thickness and thus presents a thin ribbon-like configuration. Conductor 60, which may be of a silver coated copper construction, is spiral wound to form a number of turns 65, 65′ etc. to comprise coil 23. The conductor, and the individual turns thereof, outwardly extend from coil form 27 substantially at right angles thereto and are retained thereby in a rigid, essentially inextricable fashion by having edge 64 of conductor 60 imbedded in grooves 70, 70′ etc.

At end 61 of conductor 60 a high side terminal 37 is connected. Terminal 37 generally has a C-shape configuration and includes a central section 75, a lip section 76 and a solder lug section 77. Solder lug section 77 fits through slot 52 of terminal base 19 and is maintained in a groove formed in under surface 79 of coil form 27. This surface 79 has a plurality of strengthing ribs formed thereon and is free from any of the turns of conductor 60. Lip 76 makes connection to end 61 of conductor 60 by passing through aperture 71 from the under surface 79 of coil form 27. Low side terminal 38 is fitted through slot 53 in terminal base 19 and makes contact with conductor 60 at end 62 thereof, as hereinafter described.

Through the central aperture of the coil forms, for example, aperture 71, there is extended a rotatable shaft assembly or driver means 80. Shaft assembly 80 comprises two interfitted sections 81, 82 with center shaft section 81 adapted to fit within a bore 90 formed in the front main shaft section 82. A groove 91 annularly cut within shaft section 81 forms a collar 83 which is adapted to aid in the retention of a lock spring 84 therewithin. The mounting means for the shaft assembly comprises a mounting bracket 11 having a face plate 85, sides 86, 87 and ledges 88, 89 integrally formed respectively from said sides but positioned at substantially right angles thereto. The entire end bracket is then staked or otherwise fastened in an upright fashion to base plate 18. To aid in the positioning of shaft assembly 80, one of the shields 122 has a plurality of struck-out ledges 123 which are adapted to rigidly hold a spring 124 against center shaft 82. Face plate 85 of bracket 11 has its center thereof bulged outwardly to form a bearing surface 100 while its under surface is thus depressed so as to fit-lock a spring 84 included in a groove 91 against the surface. An aperture 98 penetrates this said bearing surface and is adapted to receive in a substantially tight fashion a bushing 95 positioned against said bearing surface 100. Main shaft section 82 is supported within bushing 95. A thrust spring 101 fits over shaft section 82 against bushing 95 and supplies needed thrust for stop members 26 which includes a plurality of intermediate stop members 102, 102′ having struck-up ears 103, 104 for engaging each other to rotate the individual stops between limits formed at the top surface thereof. The intermediate stop members are contained between locating stop member 105 and a driver stop member 106 so as to determine the amount of angular excursion of the driver shaft. Driver stop member makes contact with limit 107 to determine this angular excursion or displacement of shaft assembly 80.

As seen, each of the tuner sections has a portion of center shaft 81 adapted to fit through an aperture in the coil form so as to rotate a contactor assembly thereby. Contactor assembly 31 comprises a shaft clamp 108, which has a plurality of integrally formed ears 150 adapted to fit within associated grooves in contact arm 110, which may be bent so as to firmly stake clamp 108 to contact arm 110. Clamp 108 may be bent fitted around shaft 81 to tightly conform thereto and be securely locked around the shaft by means of an integrally formed lock joint compressing extensions 111 and 112, through which a threaded member 151 may be passed so as to fixedly and adjustably lock the clamp 108 around shaft 81. Contact arm spring 154 may be moveably linked to arm 113 by means of a rivet 115. In this manner contact spring 114 may be angularly moved with respect to its associated arm 113. At the end opposite the rivet, spring 114 has integrally formed thereto a wiper 116 having a U-shaped configuration and which is so shaped as to include a recess or groove into which the turns of the conductor of coil 23 fit to allow for smooth and friction free electrical contact therealong. Low side terminal 38 is connected to annular ring section 152 of contact assembly 31 by means of a ball contact 118 formed in an integral fashion to low side contact spring 120 which may be staked to terminal 38 as at points 121 and 122 thereof. Ball contact 118 in this fashion is resiliently adapted to smoothly make contact with ring section 152.

As shaft 81 is rotated, wiper or brush 116 moves over edge 65 of conductor 60 making good electrical contact therewith and is allowed to traverse the entire spiral conductor because of the angular link joint relationship formed between arm 113 and contact spring 114. The position of brush 116 along conductor 60 thus determines the amount of inductance offered by the tuner coil. Further, since a common shaft rotates each tuner contactor assembly, these sections are all rotatable or ganged together. A dust cover 130 having a plurality of side walls 131, 132 and flaps 136 fits over the clamp strap 39 and end plate 12 within the confines of base flaps 140, 141 and ledges 88 and 89 of bracket 11. Cover 130 has a plurality of slots 143 cut therethrough so that the projections such as 160 penetrating clamp strap 39 will also penetrate slots 143 as to be used to firmly stake the cover thereon. In this fashion a tight dust cover is provided for the entire assembly.

The tuner assembly, thus novelly constructed, provides amongst other features, an improved variable tuning device exhibiting novel jointed contactor linkage and also provides parallel positioning of closely spaced terminal strips which act to reduce the amount of inductance offered thereby. Further, in the operation thereof, the linked construction of the contactor assembly is adapted to afford a cancellation of inductance as the arms move back to each other. The subject invention provides a highly efficient tuner offering many constructional advantages, improvements and simplifications which allow the utilization of the tuner in quarters where space is at a premium and where simplicity portends economy.

The present invention of a variable inductance tuning device is merely illustrative and not exhaustive in scope and since many widely different embodiments of the invention may be made without departing from the scope thereof, it is intended that all matter contained in the above description and shown in the accompanying drawing shall be interpreted as illustrative and not in a limiting sense.

What is claimed is:

1. A variable inductance tuning device having a base plate including a plurality of individual rectangular cut-out portions, a plurality of inductance tuning elements therefor, each of said elements including a terminal base fittable within each of said cut-out portions, said base having a configuration such that a portion of its thickness forms an upper level having a cross-sectional diameter greater than that of said cut-out portion, with said lower part of said thickness adapted to be snugly fitted within said cut-out portion and to penetrate said base plate whereby a shoulder is formed on said terminal base adapted to situate the same on the inside surface of said plate, a plurality of slots cut in said lower portion of said thickness, a flat insulative coil form having a circular cross-section and an integrally formed extension depending therefrom, said extension forming a pair of shoulders with said circular cross-section, said shoulders adapted to separably rest on said first shoulders of said terminal base with said extension falling within one of said slots so as to hold said coil form in a tight substantially perpendicular manner on said terminal base within said cut-out portions of said base plate, said inductance tuning elements each comprising a flat, ribbon conductor having an edge retained by said coil form so as to support said conductor in an edgewise fashion, a plurality of terminals connected to the ends of said conductor adapted to penetrate other of said slots cut in the said terminal base, and means for varying the electrical length of the conductor between said terminals so as to determine the amount of inductance in said tuning device.

2. A variable inductance tuning device having a base plate including a plurality of individual rectangular cut-out portions, a plurality of inductance tuning elements therefor, each of said elements including a terminal base fittable within each of said cut-out portions, said base having a configuration such that a portion of its thickness forms an upper level having a cross-sectional diameter greater than that of said cut-out portion, with said lower part of said thickness adapted to be snugly fitted within said cut-out portion and to penetrate said base plate whereby a shoulder is formed on said terminal base adapted to situate the same on the inside surface of said plate, a plurality of slot members cut in said lower portion of said thickness, a flat insulative coil form having a circular cross-section and an integrally formed extension depending therefrom, said extension forming a pair of shoulders with said circular cross-section, said shoulders adapted to separably rest on said first shoulders of said terminal base with said extension falling within said slots so as to hold said coil form in a tight substantially perpendicular manner on said terminal base within said cut-out portions of said base plate, said inductance tuning elements each comprising a flat, ribbon conductor having an edge retained by said coil form so as to support said conductor in an edgewise fashion, a plurality of terminals connected to the ends of said conductor adapted to penetrate other of said slots cut in the said terminal base, and means including a plurality of angularly displaceable conductor elements for varying the electrical length of the conductor between said terminals so as to determine the amount of inductance in said tuning device.

3. A variable inductance tuning device as in claim 2 wherein said means including a plurality of angularly displaceable portions has one of said portions connected to one of said terminals and the other of said portion connected to the edge of said contactor opposite the edge retained by said base.

4. A variable inductive tuning device, as in claim 2, wherein said electrical insulative base has an aperture cut therethrough centrally and includes means for driving said angularly displaceable portion along the edge of said conductor.

5. A variable inductive tuning device, as in claim 2, comprising means for fixedly connecting said driving means to one of said angularly displaceable portions and wherein one of said terminals is connected to said conductor at a point adjacent to said aperture and penetrates therethrough to the side of said base free of said conductor strip.

6. A variable inductance tuning device having a base plate including a plurality of individual rectangular cut-out portions, a plurality of inductance tuning elements therefor, each of said elements including a terminal base fittable within each of said cut-out portions, said base having a configuration such that a portion of its thickness forms an upper level having a cross-sectional diameter greater than that of said cut-out portion, with said lower part of said thickness adapted to be snugly fitted within said cut-out portion and to penetrate said base plate whereby a shoulder is formed on said terminal base adapted to situate the same on the inside surface of said plate, a plurality of slot members cut in said lower portion of said thickness, a flat insulative coil form having a circular cross-section and an integrally formed extension depending therefrom, said extension forming a pair of shoulders on meeting said circular cross-section, said shoulders adapted to rest on said first shoulders of said terminal base and said extension falling within said slots so as to hold said coil form in a tight substantially perpendicular manner on said terminal base within said cut-out portions of said base plate, said inductance tuning elements each comprising a flat conductor having an edge retained by said coil form so as to support said conductor in an edgewise fashion, a plurality of terminals connected to the ends of said conductor adapted to penetrate other of said slots cut in the said terminal base; and plural hinged means folding back on each other for varying the electrical length of the conductor between said terminals so as to determine the amount of inductance in said tuning device, said hinged means having an integrally formed U-shaped brush connected thereto adapted to ride upon the outer surface of said flat conductor.

7. A variable inductance tuning device having a base plate including a plurality of individual rectangular cut-out portions, a plurality of inductance tuning elements therefor, each of said elements including a terminal base fittable within each of said cut-out portions, said base having a configuration such that a portion of its thickness forms an upper level having a cross-sectional diameter greater than that of said cut-out portion, with said lower part of said thickness adapted to be snugly fitted within said cut-out portion and to penetrate said base plate whereby a shoulder is formed on said terminal base adapted to situate the same on the inside surface of said plate, a plurality of slot members cut in said lower portion of said thickness, a flat insulative coil form having a circular cross-section and an integrally formed extension depending therefrom, said extension forming a pair of shoulders on meeting said circular cross-section, said shoulders adapted to rest on said first shoulders of said terminal base and said extension falling within said slots so as to hold said coil form in a tight substantially perpendicular manner on said terminal base within said cut-out portions of said base plate, said inductance tuning elements each comprising a flat conductor having an edge retained by said coil form so as to support said conductor in an edgewise fashion, a plurality of terminals connected to the ends of said conductor adapted to penetrate other of said slots cut in the said terminal base, rotatable, plural hinged portions collapsible toward one another for varying the electrical length of the conductor between said terminals so as to determine the amount of inductance in said tuning device, and means for stopping the rotation of said hinged means between determined angular limits.

ROBERT J. AUST.

References Cited in the file of this patent

UNITED STATES PATENTS

| Number | Name | Date |
|---|---|---|
| 1,217,348 | Rothen | Feb. 27, 1917 |
| 1,485,462 | Lowenstein | Mar. 24, 1924 |
| 2,483,801 | Becwar | Oct. 4, 1949 |
| 2,503,582 | Ginsburg | Apr. 11, 1950 |

FOREIGN PATENTS

| Number | Country | Date |
|---|---|---|
| 4,706 | Australia | July 24, 1926 |
| 659,868 | Germany | May 11, 1938 |